US008855028B2

(12) United States Patent
Kim (10) Patent No.: US 8,855,028 B2
(45) Date of Patent: Oct. 7, 2014

(54) APPARATUS AND METHOD FOR BIDIRECTIONAL COMMUNICATION BETWEEN MULTI-NODES USING RELAY NODE

(75) Inventor: Sang Joon Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 219 days.

(21) Appl. No.: 13/367,891

(22) Filed: Feb. 7, 2012

(65) Prior Publication Data

US 2012/0207066 A1 Aug. 16, 2012

(30) Foreign Application Priority Data

Feb. 11, 2011 (KR) ........................ 10-2011-0012397

(51) Int. Cl.
*H04B 7/14* (2006.01)
*H03M 13/37* (2006.01)
*H03M 13/39* (2006.01)
*H04B 7/155* (2006.01)
*H04L 1/00* (2006.01)

(52) U.S. Cl.
CPC ...... *H03M 13/3761* (2013.01); *H03M 13/3944* (2013.01); *H04B 7/155* (2013.01); *H04L 1/0076* (2013.01)
USPC ........................................... 370/279; 375/295

(58) Field of Classification Search
USPC .......... 370/279; 375/233, 231, 265, 262, 286, 375/267, 289; 704/268, 266
See application file for complete search history.

(56) References Cited

U.S. PATENT DOCUMENTS

| | | | |
|---|---|---|---|
| 7,023,936 B2 * | 4/2006 | Sutskover et al. | 375/341 |
| 7,256,716 B2 * | 8/2007 | Liu et al. | 341/51 |
| 7,792,013 B2 * | 9/2010 | Green et al. | 370/208 |
| 8,116,702 B2 * | 2/2012 | Tosato | 455/115.1 |
| 8,254,484 B2 * | 8/2012 | Kim et al. | 375/265 |
| 2008/0225976 A1 | 9/2008 | Prasad et al. | |

FOREIGN PATENT DOCUMENTS

| | | |
|---|---|---|
| KR | 10-2008-0058870 A | 6/2008 |
| KR | 10-2010-0083731 A | 7/2010 |
| WO | WO 2007/007249 A2 | 1/2007 |

OTHER PUBLICATIONS

Sang et al., "Lattice strategies for a multi-pair bi-directional relay network," 2011 IEEE International Symposium on Information Theory Proceedings, pp. 2243-2247.*
Gesbert et al., "Multi-Cell MIMO Cooperative Networks: A New Look at Interference," IEEE Journal on selected areas in communications, vol. 28, No. 9, Dec. 2010, pp. 1-29.*
Zamir et al., "Nested Linear/Lattice Codes for Structured Multiterminal Binning," IEEE Transactions on Information Theory, vol. 48, No. 6, Jun. 2002.*

(Continued)

*Primary Examiner* — Rasheed Gidado
(74) *Attorney, Agent, or Firm* — NSIP Law (57) ABSTRACT

An apparatus for bidirectional communication between multi-nodes using a relay node receives 2M signals, encoded using a nested lattice code chain, from a base station and M user nodes in a predetermined time interval, estimates M pairwise lattice code sum signals between the base station and the M user nodes based on the nested lattice code chain with respect to the 2M encoded signals, encodes the M pairwise lattice code sum signals to broadcasting codewords to generate M encoded signals after the predetermined time interval has ended, and transmits the M encoded signals to the base station and the M user nodes.

9 Claims, 9 Drawing Sheets

(56) References Cited

OTHER PUBLICATIONS

Gunduz, D. et al. "Relaying Simultaneous Multicasts via Structured Codes." *Proceedings of the 2009 IEEE International Symposium on Information Theory (ISIT 2009)*. Jun. 28-Jul. 3, 2009. Seoul, Korea. pp. 2321-2325.

Kim, S. J. et al. "Capacity Bounds on Multi-Pair Two-Way Communication with a Base-Station Aided by a Relay." *Proceedings of the 2010 IEEE International Symposium on Information Theory (ISIT 2010)*. Jun. 13-18, 2010. Austin, Texas. pp. 425-429.

Knopp, R. "Two-Way Wireless Communication via a Relay Station," *Eurocom Repository. Paper presented at GDR-ISIS Meeting, ENST*, Paris, France. Mar. 29, 2007. pp. 1-21.

Song, Y. et al. "List Decoding for Nested Lattices and Applications to Relay Channels." *Proceedings of Forty-Eighth Allerton Conference, 2010 IEEE*. Allerton House, UIUC, Illinois, USA. Sep. 29-Oct. 1, 2010. pp. 1038-1045.

Wilson, M. P. et al. (May 1, 2008). "Joint Physical Layer Coding and Network Coding for Bi-Directional Relaying." *arXiv*. pp. 1-24.

European Extended Search Report mailed Sep. 13, 2012, issued in counterpart European Patent Application No. 12 154 270.8; 10 pages in English language.

M. Costa, "Writing on Dirty Paper," *IEEE Transactions on Information Theory*, vol. IT-29, No. 3, May 1983, pp. 439-441.

\* cited by examiner

APPARATUS AND METHOD FOR BIDIRECTIONAL COMMUNICATION BETWEEN MULTI-NODES USING RELAY NODE

CROSS-REFERENCE TO RELATED APPLICATIONS

This application claims the benefit of Korean Patent Application No. 10-2011-0012397 filed on Feb. 11, 2011, in the Korean Intellectual Property Office, the entire disclosure of which is incorporated herein by reference for all purposes.

BACKGROUND

1. Field

The following description relates to a method and an apparatus for performing communication using a relay node between multi-nodes.

2. Description of Related Art

It is important to effectively share radio communication channel resources within a limited space, so that a plurality of nodes may effectively perform communication. While performing communication between the plurality of nodes, a relay node may be used to enhance the power efficiency and a communication distance.

In particular, when using a half-duplex relay node, the relay node may communicate with a plurality of nodes using a decode and forward (DF) scheme, a compress and forward (CF) scheme, an amplify and forward (AF) scheme, and the like.

In the DF scheme, the relay node decodes signals received from a plurality of nodes to thereby restore a message transmitted from each of the nodes. Next, the relay node encodes the restored messages again and transmits the encoded messages to destination nodes to which the nodes desire to transmit the messages.

In the CF scheme, the relay node maps signals received from the plurality of nodes to signals that are quantized based on a predetermined quantization map. Next, the relay node transmits messages corresponding to the quantized signals to the plurality of nodes using a broadcasting scheme.

In the AF scheme, the relay node amplifies and retransmits signals received from the plurality of nodes without a separate signal processing process.

There may be some constraints when a retransmission scheme of the relay node using the above schemes is applied to a multi-pair environment in which the plurality of nodes perform communication as pairs.

In the DF scheme, the relay node needs to decode all of the received signals, and thus a computation complexity increases. In the CF scheme and the AF scheme, interference may occur between the received signals, and there are some constraints in cancelling noise.

SUMMARY

According to an aspect, an apparatus for bidirectional communication between multi-nodes using a relay node includes a receiver configured to receive 2M signals, encoded using a nested lattice code chain, from a base station and M user nodes in a predetermined time interval; a decoding unit configured to estimate M pairwise lattice code sum signals between the base station and the M user nodes based on the nested lattice code chain with respect to the 2M encoded signals; and a transmitter configured to encode the M pairwise lattice code sum signals to broadcasting codewords to generate M encoded signals after the predetermined time interval has ended, and transmit the M encoded signals to the base station and the M user nodes.

The decoding unit may include a first decoder configured to estimate linear combination signals by performing Euclidean lattice decoding of the 2M encoded signals, based on a predetermined generator matrix, within a range of a coarsest lattice code set; and a second decoder configured to estimate the M pairwise lattice code sum signals based on a relationship between a linear combination vector including the estimated linear combination signals as elements and a restore matrix including integers as elements.

The generator matrix may include 1 and 0 as elements; ones of the elements corresponding to signals to be recognized as messages among the 2M encoded signals are set to 1; ones of the elements corresponding to signals to be recognized as noise among the 2M encoded signals are set to 0; and a product of the generator matrix and the restore matrix is an identity matrix.

Ones of the elements corresponding to signals that map to the coarsest lattice code set among the 2M encoded are set to 1 so that the mapping signals may be recognized as the messages.

According to an aspect, an apparatus for bidirectional communication between multi-nodes using a relay node includes a lattice encoding unit configured to generate M encoded signals by mapping M transmission messages to M lattice codewords in a nested lattice code chain including 2M lattices; a dithering unit configured to generate M transmission signals by dithering the M encoded signals to satisfy a power constraint criterion of a transmission channel; and a mixing unit configured to mix the M transmission signals into a single output signal.

A base station, the relay node, and M user nodes may use the same nested lattice code chain.

The 2M lattices may have different sizes; and each of the 2M lattices except a smallest one of the 2M lattices may include at least one smaller lattice.

The bidirectional communication apparatus may further include a transmitter configured to transmit the single output signal to the relay node in a predetermined time interval.

According to an aspect, an apparatus for bidirectional communication between multi-nodes using a relay node includes a receiver configured to receive a single signal, encoded using a lattice code, and (M−1) signals, broadcast encoded, from a base station in a predetermined time interval, and receive a signal, encoded using the lattice code, from one of M user nodes in a predetermined time interval; and a decoding unit configured to estimate a lattice code sum signal with respect to the single encoded signal that is received from the base station and the encoded signal that is received from one of the M user nodes.

The receiver may be further configured to receive M signals, encoded using the lattice code, from the base station in a plurality of different time intervals, and receive M signals, encoded using the lattice code, from the M user nodes in the plurality of different time intervals; and the decoding unit may be further configured to estimate M lattice code sum signals with respect to the M signals received from the base station and the M signals received from the M user nodes corresponding to the M signals.

The bidirectional communication apparatus may further include a transmitter configured to encode the M lattice code sum signals to broadcasting codewords to generate M encoded signals, and transmit the M encoded signals to the base station and the M user nodes after the plurality of different time intervals have ended.

According to an aspect, an apparatus for bidirectional communication between multi-nodes using a relay node includes a lattice encoding unit configured to generate a lattice encoded signal by mapping one of M transmission messages to a lattice codeword; a general encoding unit configured to generate (M−1) general encoded signals by encoding, to broadcasting codewords, remaining (M−1) transmission messages of the M transmission messages excluding the transmission message that was lattice encoded message by the lattice encoding unit; a dithering unit configured to generate a single transmission signal by dithering the lattice encoded signal to satisfy a power constraint criterion of a transmission channel; a broadcasting unit configured to generate another single transmission signal by performing Costa's dirty paper coding of the (M−1) general encoded signals; and a mixing unit configured to mix the two single transmission signals into a single output signal.

According to an aspect, a method for bidirectional communication between multi-nodes using a relay node includes receiving 2M signals, encoded using a nested lattice code chain, from a base station and M user nodes in a predetermined time interval; estimating M pairwise lattice code sum signals between the base station and the M user nodes based on the nested lattice code chain with respect to the 2M encoded signals; encoding the M pairwise lattice code sum signals to broadcasting codewords to generate M encoded signals after the predetermined time interval has ended; and transmitting the M encoded signals to the base station and the M user nodes.

The estimating may include estimating linear combination signals by performing Euclidean lattice decoding of the 2M encoded signals, based on a predetermined generator matrix, within a range of a coarsest lattice code set; and estimating the M pairwise lattice code sum signals based on a relationship between a linear combination vector including the estimated linear combination signals as elements and a restore matrix including integers as elements.

According to an aspect, a method for bidirectional communication between multi-nodes using a relay node includes generating M encoded signals by mapping M transmission messages to M lattice codewords in a nested lattice code chain including 2M lattices; generating M transmission signals by dithering the M encoded signals to satisfy a power constraint criterion of a transmission channel; and mixing the M transmission signals into a single output signal.

According to aspects, a relay node may estimate pairwise lattice code sum signals between a base station and a plurality of user nodes with respect to a plurality of signals that are received from the base station and the plurality of user nodes, and may decode received signals, thereby decreasing a computation complexity.

According to aspects, a relay node may decode and retransmit a plurality of signals received from a base station and a plurality of user nodes, based on pairwise lattice code sum signals, thereby effectively removing noise and interference signals.

According to aspects, while performing bidirectional communication with a plurality of user nodes in a pairwise manner, a single base station may perform lattice encoding of a transmission message from one of the user nodes and transmit the lattice encoded transmission message to a relay node, and may perform general encoding of transmission messages from remaining ones of the user nodes and transmit the general encoded transmission messages to the relay node, thereby decreasing a computation complexity of the relay node.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be apparent to those of ordinary skill in the art. The sequences of processing steps and/or operations described are merely examples, and are not limited to the specific sequences set forth herein, and may be changed as is known in the art, with the exception of steps and/or operations necessarily occurring in a certain order. Also, description of well-known functions and constructions may be omitted for increased clarity and conciseness.

Hereinafter, embodiments will be described with reference to the accompanying drawings. Throughout the drawings and the detailed description, the same drawing reference numerals refer to the same elements. The relative size and depiction of these elements may be exaggerated for clarity, illustration, and convenience.

Figure 1:
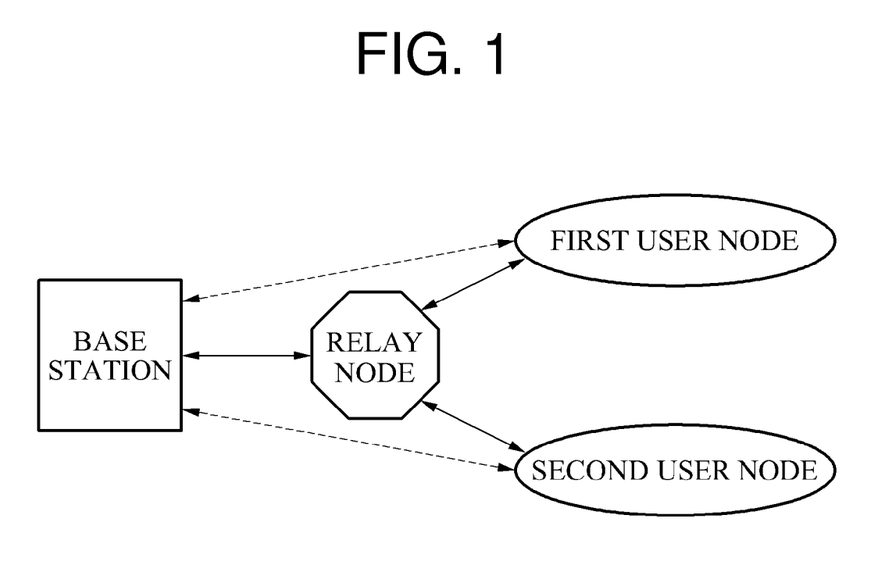
FIG. 1 is a diagram illustrating an example of a bidirectional communication system between multi-nodes using a relay node.

FIG. 1 illustrates an example of a bidirectional communication system between multi-nodes using a relay node.

The bidirectional communication system between the multi-nodes using the relay node may be represented by a single base station, a plurality of user nodes, and a single relay node. The single base station and the plurality of nodes may perform bidirectional communication. For example, when M user nodes are present, the base station may transmit M independent messages to the M user nodes, and the M user nodes may respectively transmit M other independent messages to the base station.

In this example, the relay node functions to assist the bidirectional communication between the base station and the M user nodes. For example, the base station may transmits a message to each of the M user nodes via the relay node, and each of the M user nodes transmits a message to the base station via the relay node.

The single base station and the plurality of user nodes may be inclusively referred to as multi-nodes.

Referring to FIG. 1, the bidirectional communication system between the multi-nodes using the relay node includes a base station, a relay node, a first user node, and a second user node. The base station, the relay node, the first user node, and the second user node may transmit messages using the same transmission channel.

Even though the base station, the first user node, and the second user node generally transmit and receive a message via the relay node, messages may be directly transmitted and received between the base station and the first user node, and between the base station and the second user node.

The base station, the first user node, the second user node, and the relay node may transmit and receive a signal using a half-duplex scheme. Accordingly, the base station, the first user node, the second user node, and the relay node may not simultaneously receive and transmit a signal.

Figure 2A:
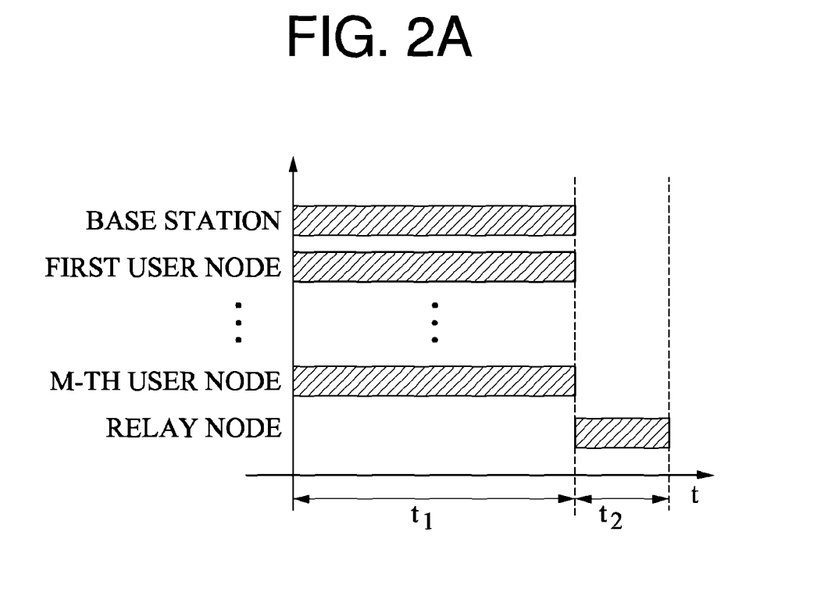
FIGS. 2A and 2B are diagrams illustrating examples of protocols applicable in a bidirectional communication system between multi-nodes using a relay node.
Figure 2B:
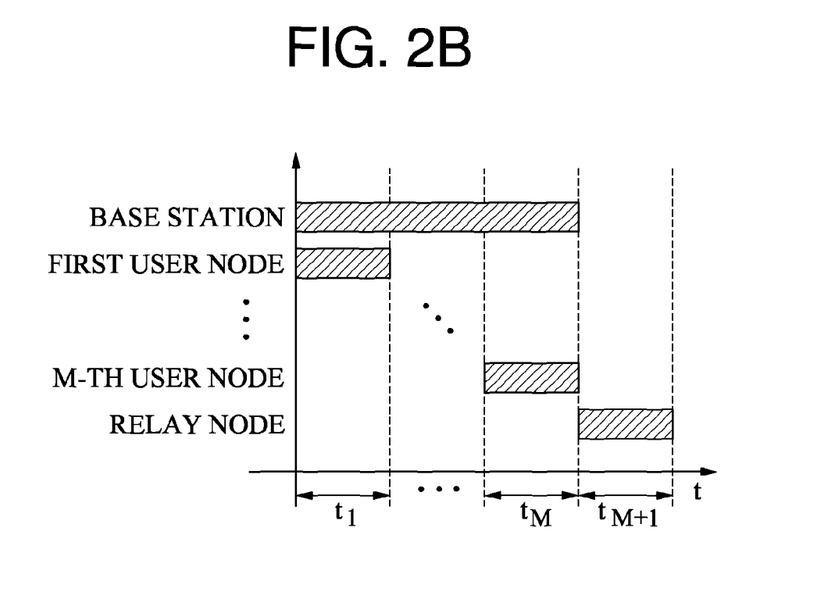

FIGS. 2A and 2B illustrate examples of protocols applicable in a bidirectional communication system between multi-nodes using a relay node.

Two types of communication protocols may be used based on a half-duplex characteristic among a base station, the relay node, and user nodes. FIG. 2A shows a full multiple access broadcast (FMABC) protocol, and FIG. 2B shows a partial multiple access broadcast (PMABC) protocol.

In the FMABC protocol, the base station and the user nodes may transmit messages over a full time interval. Referring to FIG. 2A, over a full time interval $t_1$, the base station, a first user node, a second user node, ..., and an M-th user node transmit a message to the relay node. The base station transmits M independent messages to the relay node, and each user node transmits a single independent message to the relay node. The relay node receives messages transmitted from the base station, the first user node, the second user node, ..., and the M-th user node. In a time interval $t_2$, the relay node transmits the received messages to the base station, the first user node, the second user node, ..., and the M-th user node.

In the PMABC protocol, only a user node corresponding to a predetermined time interval transmits a message. Referring to FIG. 2B, the base station transmits a message in time intervals $t_1, t_2, \ldots, t_M$, and each of the user nodes transmits a message only in a corresponding one of the time intervals $t_1, t_2, \ldots, t_M$. For example, the first user node transmits a message only in $t_1$, and the M-th user node transmits a message only in $t_M$. Accordingly, in $t_1$, the relay node receives messages transmitted from the base station and the first user node, and the remaining user nodes receive messages transmitted from the base station. In $t_M$, the relay node receives messages transmitted from the base station and the M-th user node. In $t_{M+1}$, the relay node transmits the messages received in $t_1, t_2, \ldots, t_M$ to the base station, the first user node, the second user node, ..., and the M-th user node.

Figure 3:
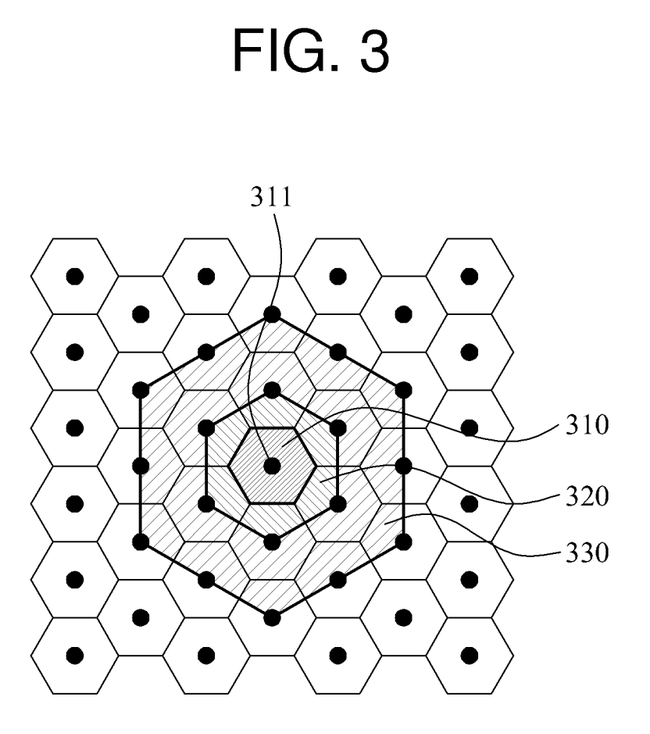
FIG. 3 is a diagram illustrating an example of a nested lattice code chain used in a bidirectional communication system between multi-nodes using a relay node.

FIG. 3 illustrates an example of a nested lattice code chain used in a bidirectional communication system between multi-nodes using a relay node.

The nested lattice code chain may be used for the bidirectional communication system between the multi-nodes using the relay node of an FMABC protocol. The nested lattice code chain may include a plurality of lattices, and each lattice may have a different unit size.

Referring to FIG. 3, the nested lattice code chain includes a lattice 310, a lattice 320, and a lattice 330. The lattice 310 is provided in a smallest hexagon, the lattice 320 is provided in a hexagon larger than the lattice 310, and the lattice 330 is provided in a hexagon larger than the lattice 320. Each lattice may be represented by $\Lambda$. For instance, the lattice 310 may be represented by a fine lattice $\Lambda c$, the lattice 320 may be represented by $\Lambda 1$, and the lattice 330 may be represented by $\Lambda 2$.

In the nested lattice code chain, the lattice 330 is included in the lattice 320 and the lattice 320 is included in the lattice 310. In the nested lattice code chain, the lattices 310, 320, and 330 have a relationship of $\Lambda 2 \subseteq \Lambda 1 \subseteq \Lambda c$.

An internal area of the lattice 320 indicates a first lattice code set, and may be represented by $\Lambda c \bmod \Lambda 1$, which indicates an area included in the lattice 320 in an area of the lattice 310. An internal area of the lattice 330 indicates a second lattice code set, and may be represented by $\Lambda c \bmod \Lambda 2$, which indicates an area included in the lattice 330 in the area of the lattice 310. A lattice point 311 indicates a codeword of a lattice code.

Figure 4:
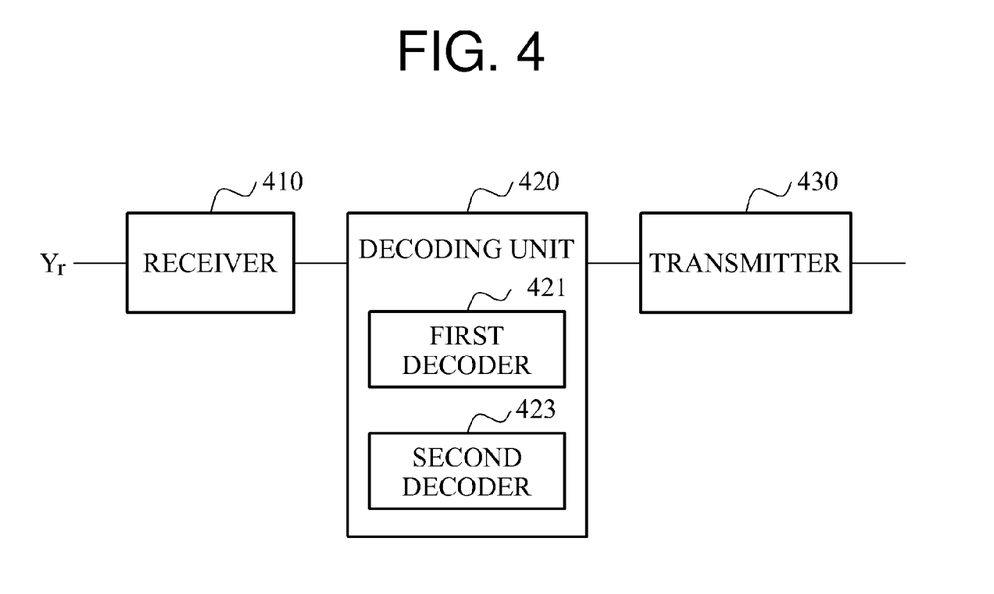
FIG. 4 is a block diagram illustrating an example of a bidirectional communication apparatus between multi-nodes using a relay node from the point of view of the relay node.

FIG. 4 is a block diagram illustrating an example of a bidirectional communication apparatus between multi-nodes using a relay node from the point of view of the relay node. More specifically, FIG. 4 is a block diagram illustrating an example of a portion of the bidirectional communication apparatus corresponding to the relay node. In the following description, the bidirectional communication apparatus performs a functionality of the relay node using an FMABC protocol.

Referring to FIG. 4, the bidirectional communication apparatus between the multi-nodes using the relay node includes a receiver 410, a decoding unit 420, and a transmitter 430.

The receiver 410 receives 2M signals encoded using a nested lattice code chain from a base station and M user nodes in a predetermined time interval. The predetermined time interval may be $t_1$ of FIG. 2A.

The base station transmits M independent transmission messages using the nested lattice code chain. The nested lattice code chain includes 2M lattices. The base station maps and encodes the M independent transmission messages to M lattice codewords among 2M lattice codewords. The base station transmits M encoded signals to the relay node.

Each of the M user nodes encodes a single independent transmission message using the nested lattice code chain. The nested lattice code chain includes 2M lattices. Each of the M user nodes maps and encodes the single independent transmission message to a single lattice codeword among the 2M lattice codewords. Since each of the M user nodes encodes a single independent transmission message, a total of M independent transmission messages may be mapped to M lattice codewords, respectively. Each of the M user nodes transmits a single encoded signal to the relay node.

Since the receiver 410 receives the M encoded signals from the base station and receives the M encoded signals from the M user nodes, the receiver 410 receives a total of 2M encoded signals.

The receiver 410 receives a signal $Y_r$ transmitted from the base station and the M user nodes. $Y_r$ includes the M encoded signals that are transmitted from the base station, the M encoded signals that are transmitted from the M user nodes, and channel noise.

Existing techniques of estimating lattice code sum signals may be applied when bidirectional communication is performed between a single base station and a single user node. Disclosed herein is a method of estimating lattice code sum signals when bidirectional communication is performed between a single base station and M user nodes.

The decoding unit 420 estimates M pairwise lattice code sum signals between the base station and the M user nodes based on the nested lattice code chain with respect to the 2M encoded signals.

The decoding unit 420 does not estimate each of the M encoded signals that are received from the base station and the M encoded signals that are received from the M user nodes. The decoding unit 420 estimates a lattice code sum signal that is a vector sum of a single encoded signal received from the base station and a single pairwise encoded signal received from a user node. Accordingly, the decoding unit 420 estimates M lattice code sum signals that are vector sums of the M encoded signals received from the base station and the M encoded signals received from user nodes corresponding to the M encoded signals. In this example, the decoding unit 420 estimates the M lattice code sum signals based on the nested lattice code chain.

When $C_{0,i}$ ($1 \leq i \leq M$) indicates the M encoded signals that are received from the base station, and $C_{i,0}$ ($1 \leq i \leq M$) indicates the M encoded signals that are received from the M user nodes, the decoding unit 420 estimates a lattice code sum signal $C_i$ that is $C_{0,i}+C_{i,0}$, instead of estimating each of $C_{0,i}$ and $C_{i,0}$.

Unlike a decode and forward (DF) scheme of restoring 2M messages, the decoding unit 420 restores a total of M messages by decoding the lattice code sum signals of the M encoded signals received from the base station and the M encoded signals received from the M user nodes. Accordingly, compared to the DF scheme, it is possible to decrease a computation complexity and enhance a transmission rate of signals.

The decoding unit 420 estimates the M lattice code sum signals through two processes. Specifically, the decoding unit 420 estimates the M lattice code sum signals using a first decoder 421 and a second decoder 423.

The decoding unit 420 estimates a linear combination signal $t_i$ from the received signal $Y_r$, and estimates a lattice code sum signal $C_i$ from a set $\{t_i\}$ of linear combination signals. The set $\{t_i\}$ of linear combination signals includes elements $t_i$ that are formed as linear combinations of $C_i$.

The relationship between a set $\{C_i\}$ of lattice code sum signals and the set $\{t_i\}$ of linear combination signals may be expressed as follows:

$$C=[C_1, \ldots, C_m] \bmod \Lambda max, t=[t_1, \ldots, t_n] \bmod \Lambda max$$

In this example, C and t are vectors that include $C_i$ and $t_i$ as elements, respectively, $\Lambda max$ is a coarsest lattice, and mod denotes a modulo computation. Thus, C and t are estimated within an area of $\Lambda max$. The area of $\Lambda max$ corresponds to a coarsest lattice code set.

Coarse lattices are lattices that are not a fine lattice. The coarsest lattice is a coarse lattice having a largest unit size among a plurality of coarse lattices. The coarsest lattice is represented by $\Lambda max$. Coarse lattices and fine lattices are well known to one of ordinary skill in the art, and accordingly will not be further described herein.

The linear combination relationship between C and t may be expressed as follows:

$$t=CG \bmod \Lambda max, C=tH \bmod \Lambda max, GH=I$$

In this example, G denotes an m×n generator matrix including 1 and 0 as elements, H denotes an n×m restore matrix including integers as elements, and I denotes an m×m identity matrix. The product of the generator matrix and the restore matrix is the identity matrix. The generator matrix is named the generator matrix because it generates C from t, and the restore matrix is named the restore matrix because it restores t from C. The generator matrix and the restore matrix may be preset.

For example, when m=4 and n=4, G and H may be expressed as follows:

$$G = \begin{bmatrix} 1 & 1 & 1 & 1 \\ 0 & 1 & 1 & 1 \\ 0 & 0 & 1 & 1 \\ 0 & 0 & 0 & 1 \end{bmatrix}, H = \begin{bmatrix} 1 & -1 & 0 & 0 \\ 0 & 1 & -1 & 0 \\ 0 & 0 & 1 & -1 \\ 0 & 0 & 0 & 1 \end{bmatrix}$$

The decoding unit 420 estimates the linear combination signal $t_i$ from the received signal $Y_r$ using the first decoder 421.

The first decoder 421 estimates linear combination signals by performing Euclidean lattice decoding of the 2M encoded signals, based on a predetermined generator matrix, within a coarsest lattice code set.

For example, the first decoder 421 generates $Y_{r,i}$ from $Y_r$ as follows:

$$Y_r = X_{0,1} + \ldots + X_{0,M} + X_1 + \ldots + X_M + Z_r$$

$$Y_{r,i} = (\alpha_i \cdot Y_r + g_{1i}(u_{0,1}+u_{1,0}) + \ldots + g_{Mi}(u_{0,M}+u_{M,0})) \bmod \Lambda max = (t_i + Z_i) \bmod \Lambda max$$

In this example, $\alpha_i$ denotes a predetermined constant and is set to a value minimizing a minimum mean square error (MMSE), $g_{ji}$ denotes an element of a j-th row and an i-th column of the generator matrix G, and $u_{0,i}$ and $u_{i,0}$ denotes a dither vector.

Also, the first decoder 423 generates $Z_i$ as follows:

$$Z_i = -(1-\alpha_i)(g_{1i}(X_{0,1}+X_1) + \ldots + g_{Mi}(X_{0,M}+X_M)) + \alpha_i((1-g_{1i})(X_{0,1}+X_1) + \ldots + (1-g_{Mi})(X_{0,M}+X_M) + Z_r)$$

In this example, $X_{0,i}$ denotes an encoded signal that is transmitted from the base station, $X_i$ denotes an encoded signal that is transmitted from a user node, and $Z_r$ denotes channel noise.

When a value of $\alpha_i$ is set, a value of $Z_i$ may be determined, and thus the first decoder 421 may estimate a closest lattice point to $Y_{r,i}$ and thereby estimate the linear combination signal $t_i$.

A process of estimating $t_i$ from $Y_{r,i}$ may be performed through Euclidean lattice decoding.

The generator matrix includes 1 and 0 as elements. Elements corresponding to signals to be recognized as messages among the 2M encoded signals are set to 1, and elements corresponding to signals to be recognized as noise among the 2M encoded signals are set to 0.

An element $g_{ji}$ of the generator matrix is set to 1 so that a signal to be recognized as a message among the 2M encoded signals from the received signal $Y_r$ may be computed in $Y_{r,i}$.

In the generator matrix, elements corresponding to signals that map to the coarsest lattice code set among the 2M signals are set to 1 so that the mapping signals may be recognized as the messages. The linear combination signal may be estimated within the coarsest lattice code set. Therefore, when the mapping signals are included in the coarsest lattice code set, the mapping signals may be set to be recognized as the messages, and may be computed as the linear combination signals. Also, the above setting of the elements as described above may be assumed to perform Euclidean lattice decoding.

The second decoder 423 estimates the M lattice code sum signals based on a relationship between a linear combination vector including the estimated linear combination signals as elements and a restore matrix including integers as elements.

The second decoder 423 estimates the lattice code sum signal $C_i$ based on the following:

$$C = tH \bmod \Lambda \max.$$

The transmitter 430 encodes the M lattice code sum signals to broadcasting codewords after the predetermined time interval has ended, and transmits the M encoded signals to the base station and the M user nodes.

A next time interval after the predetermined time interval has ended may be $t_2$ in FIG. 2A.

The receiver 410, the decoding unit 420, the first decoder 421, the second decoder 423, and the transmitter 430 in FIG. 4 may be hardware devices, or may be software modules implemented by a processor or a computer executing software that performs the operations described above, or may be a combination of hardware devices and software modules.

Figure 5:
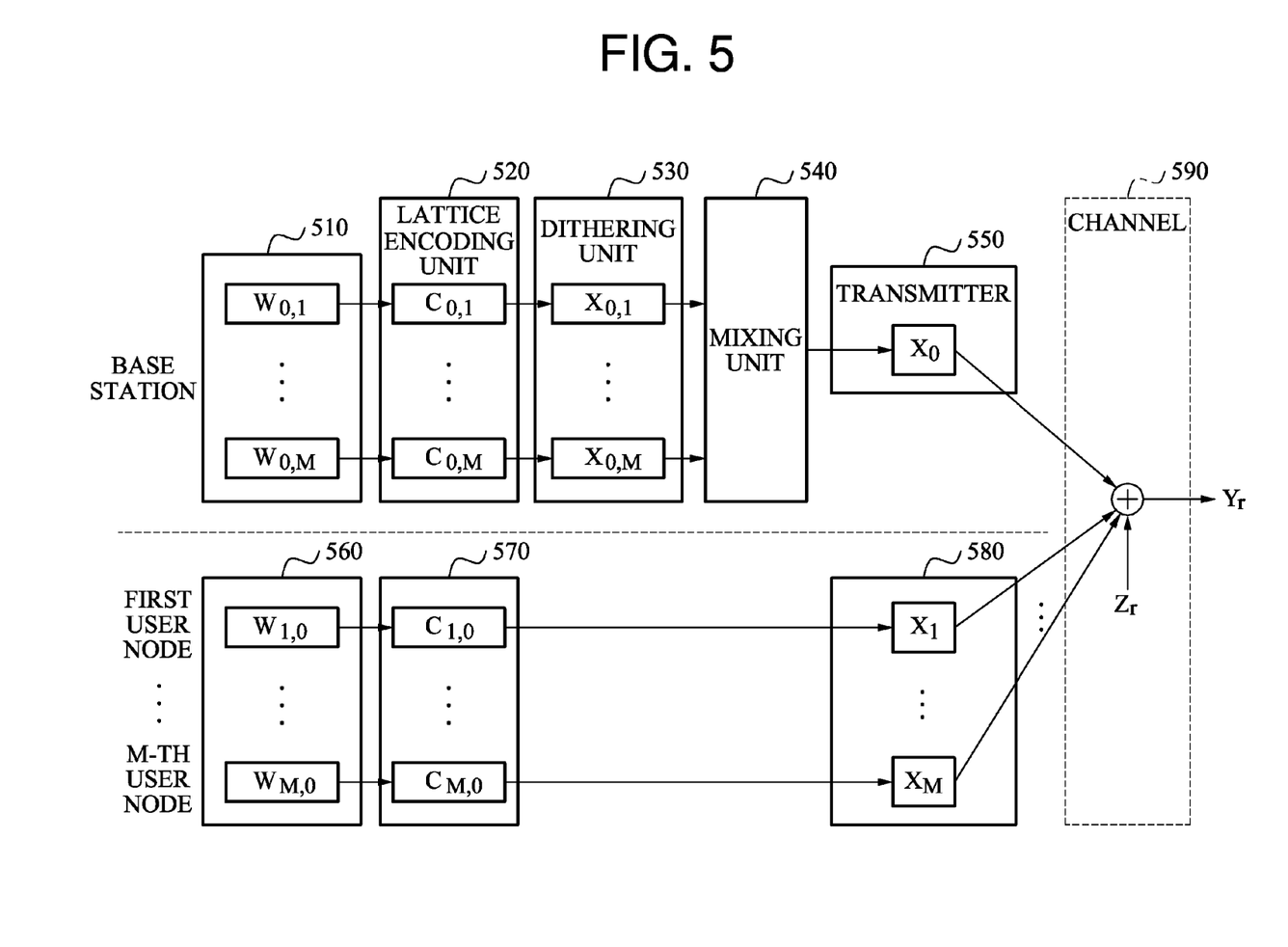
FIG. 5 is a block diagram illustrating an example of a bidirectional communication apparatus between multi-nodes using a relay from the point of view of a base station and a plurality of user nodes.

FIG. 5 is a block diagram illustrating an example of a bidirectional communication apparatus between multi-nodes using a relay node from the point of view of a base station and a plurality of user nodes. More specifically, FIG. 5 is a block diagram illustrating an example of portions of the bidirectional communication apparatus corresponding to the multi-nodes, i.e., the base station and the plurality of user nodes. In the following description, the bidirectional communication apparatus performs functionalities of the base station and the plurality of user nodes using an FMABC protocol.

Referring to FIG. 5, the bidirectional communication apparatus includes a lattice encoding unit 520, a dithering unit 530, a mixing unit 540, and a transmitter 550.

The lattice encoding unit 520 generates M encoded signals by mapping M transmission messages 510 to M lattice codewords in a nested lattice code chain including 2M lattices.

The M transmission messages 510 may be represented by $W_{0,1}, \ldots, W_{0,M}$, and the M encoded signals may be represented by $C_{0,1}, \ldots, C_{0,M}$.

The nested lattice code chain may be set to be the same among the base station, the relay node, and M user nodes so that the base station and the M user nodes may encode the M transmission messages using the same nested lattice code chain, and the relay node may encode M lattice code sum signals using the same nested lattice code chain.

The nested lattice code chain may include 2M lattices having different sizes. Each of the 2M except a smallest one of the 2M lattices may include at least one smaller lattice as shown, for example, in FIG. 3.

The dithering unit 530 generates M transmission signals by dithering the M encoded signals to satisfy a power constraint criterion of a transmission channel 590.

The dithering unit 530 generates M transmission signals by adding or subtracting a dither vector with respect to the M encoded signals $C_{0,1}, \ldots, C_{0,M}$. The M transmission signals may be represented by $X_{0,1}, \ldots, X_{0,M}$.

The M transmission signals may be expressed as follows:

$$X_{0,i} = (C_{0,i} - u_{0,i}) \bmod \Lambda_{0,i}$$

In this example, $X_{0,i}$ denotes an i-th transmission signal, $u_{0,i}$ denotes a dither vector, and $\Lambda_{0,i}$ denotes an i-th lattice to be mapped to an i-th transmission message by the base station using the nested lattice code chain. For example, a transmission signal may be generated by dithering an encoded signal that is mapped to a codeword of a corresponding lattice.

The mixing unit 540 mixes the M transmission signals into a single output signal. The output signal may be represented by $X_0$. For example, $X_0 = X_{0,1} + \ldots + X_{0,M}$.

The transmitter 550 transmits the single output signal $X_0$ to the relay node in a predetermined time interval.

The M user nodes generate transmission signals $X_1, \ldots, X_M$ by lattice encoding transmission messages 560 to generate encoded signals with a lattice encoding unit 570, and dithering the encoded signals with a dithering unit 580 to generate the transmission signals $X_1, \ldots, X_M$. For example, the first user node generates an encoded signal $C_{1,0}$ by lattice encoding $W_{1,0}$, and generates a transmission signal $X_1$ by dithering the encoded signal $C_{1,0}$. Similarly, the M-th user node generates an encoded signal $C_{M,0}$ by lattice encoding a transmission message $W_{M,0}$, and generates a transmission signal $X_M$ by dithering the encoded signal $C_{M,0}$.

The transmission signal $X_0$ transmitted from the transmitter 550 of the base station, the transmission signals $X_1, \ldots, X_M$ transmitted from the M user nodes, and noise $Z_r$ of the transmission channel 590 are mixed in the same transmission channel 590 to obtain $Y_r$. The mixed signal $Y_r$ is transmitted to the relay node. For example, $Y_r = X_0 + X_1 + \ldots + X_M + Z_r$.

The lattice encoding unit 520, the dithering unit 530, the mixing unit 540, the transmitter 550, the lattice encoding unit 570, and the dithering unit 580 in FIG. 5 may be hardware devices, or may be software modules implemented by a processor or a computer executing software that performs the operations described above, or may be a combination of hardware devices and software modules.

Figure 6:
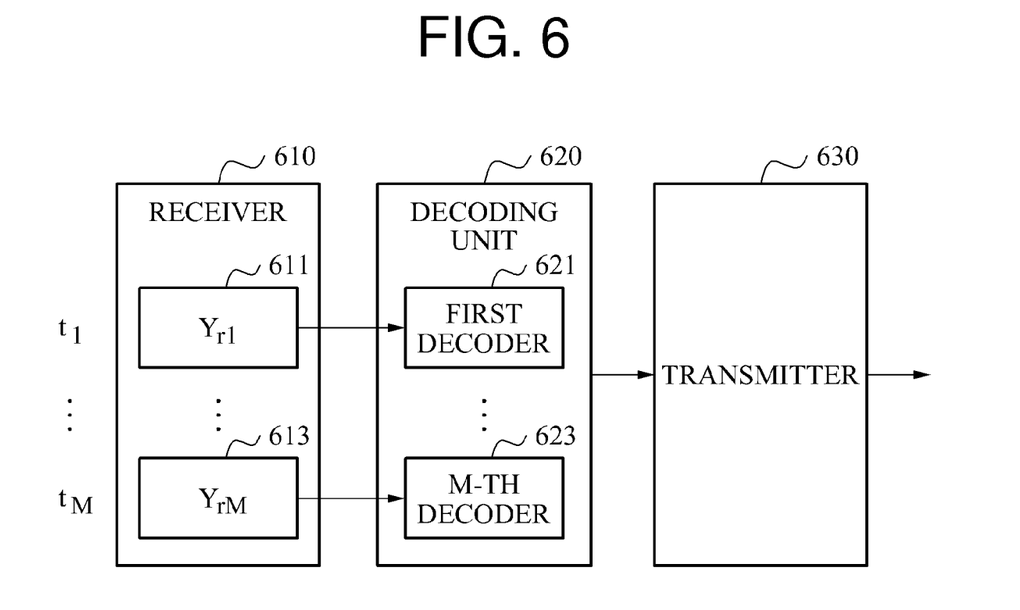
FIG. 6 is a block diagram illustrating another example of a bidirectional communication apparatus between multi-nodes using a relay from the point of view of the relay node.

FIG. 6 is a block diagram illustrating another example of a bidirectional communication apparatus between multi-nodes using a relay node from the point of view of the relay node. More specifically, FIG. 6 is a block diagram illustrating another example of the portion of the bidirectional communication apparatus corresponding to the relay node. In the following description, the bidirectional communication apparatus performs a functionality of the relay node using a PMABC protocol.

Referring to FIG. 6, the bidirectional communication apparatus includes a receiver 610, a decoding unit 620, and a transmitter 630.

The receiver 610 receives a single signal encoded using a lattice code, and (M−1) broadcast encoded signals, from a base station in a predetermined time interval, and receives a signal encoded using the lattice code from one of M user nodes in the predetermined time interval.

The receiver 610 receives M signals, encoded using the lattice code, from the base station, and receives M signals, encoded using the lattice code, from the M user nodes, in a plurality of different time intervals.

The receiver 610 receives a signal $Y_{r1}$ 611 in $t_1$. In this example, $t_1$ may be the same as $t_1$ in FIG. 2B. The receiver 610 receives a signal $Y_{rM}$ 613 in $t_M$. In this example, $t_M$ may be the same as $t_M$ in FIG. 2B. The signal $Y_{r1}$ 611 includes a transmission signal $X_0$ that is generated by the base station, a transmission signal $X_1$ that is generated by the first user node, and noise $Z_r$ of a transmission channel. In this example, the transmission signal $X_0$ is generated by mixing a transmission signal that is generated by dithering a single signal that is encoded using a lattice code, and a single signal that is generated using Costa's dirty paper coding. Costa's dirty paper coding is a coding technique that is well known to one of ordinary skill in the art, and thus will not be described in detail herein. Costa's dirty paper coding was first described in M. Costa, "Writing on Dirty Paper," *IEEE Transactions on Information Theory*, Vol. IT-29, No. 3, May 1983, pp. 439-441.

The decoding unit 620 estimates a lattice code sum signal with respect to the single encoded signal that is received from the base station and the encoded signal that is received from one of M user nodes.

The decoding unit 620 estimates M lattice code sum signals with respect to the M signals received from the base station and the M signals received from the M user nodes corresponding to the M signals.

The decoding unit 620 includes a first decoder 621 to an M-th decoder 623. The first decoder 621 estimates the lattice code sum signal with respect to the signal $Y_{r1}$ 611. The M-th decoder 623 estimates the lattice code sum signal with respect to the signal $Y_{rM}$ 613.

The transmitter 630 encodes the M lattice code sum signals to broadcasting codewords, and transmits the M encoded signals to the base station and the M user nodes after the plurality of different time intervals have ended. In this example, a time interval after the plurality of different time intervals have ended may be the same as $t_{M+1}$ in FIG. 2B. The transmitter 630 performs Costa's dirty paper coding of the M lattice code sum signals, and transmits the encoded signals.

The receiver 610, the decoding unit 620, the first decoder 621 through the M-th decoder 623, and the transmitter 630 in FIG. 6 may be hardware devices, or may be software modules implemented by a processor or a computer executing software that performs the operations described above, or may be a combination of hardware devices and software modules.

Figure 7:
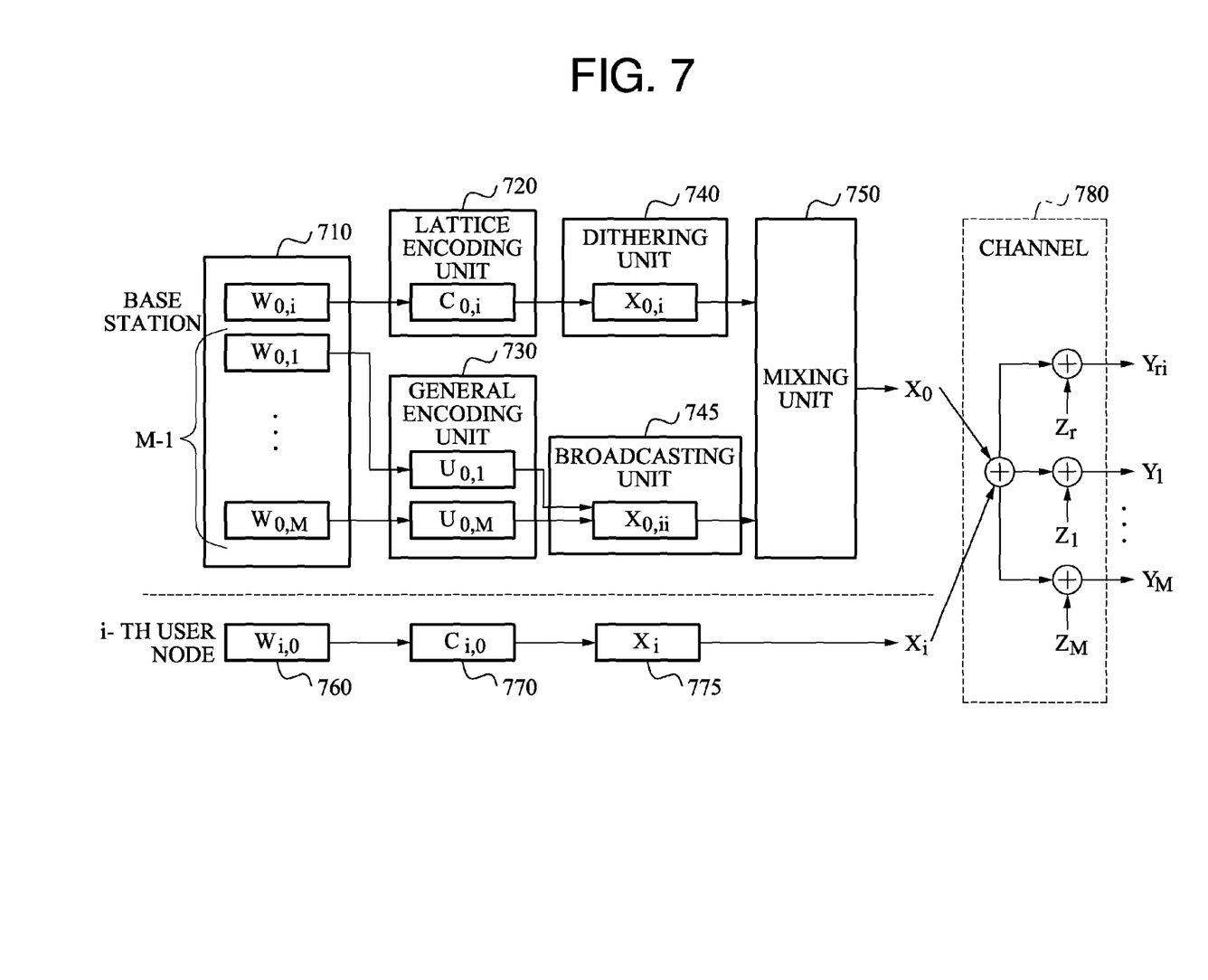
FIG. 7 is a block diagram illustrating an example of a bidirectional communication apparatus between multi-nodes using a relay node from the point of view of a base station and a user node.

FIG. 7 is a block diagram illustrating an example of a bidirectional communication apparatus between multi-nodes using a relay node from the point of view of a base station and a user node. More specifically, FIG. 7 illustrates an example of the portions of the bidirectional communication apparatus corresponding to the multi-nodes, i.e., the base station and the user node. In the following description, the bidirectional communication apparatus performs functionalities of the base station and the user node using a PMABC protocol.

Referring to FIG. 7, the bidirectional communication apparatus includes a lattice encoding unit 720, a general encoding unit 730, a dithering unit 740, a broadcasting unit 745, and a mixing unit 750.

The lattice encoding unit 720 generates a lattice encoded signal by mapping a lattice codeword a single transmission message among M transmission messages 710.

The single transmission message may be represented by $W_{0,i}$, and the lattice encoded signal may be represented by $C_{0,i}$.

For example, the lattice encoding unit 720 generates a lattice encoded signal $C_{0,i}$ by lattice encoding a single transmission message $W_{0,i}$ that an i-th user node desires to transmit among M transmission messages 710.

The general encoding unit 730 generates (M−1) general encoded signals by encoding, to broadcasting codewords, the remaining (M−1) transmission messages of the M transmission messages 710 excluding the single transmission message that was lattice encoded by the lattice encoding unit 720.

In this example, the (M−1) transmission messages excluding the single transmission message $W_{0,i}$ that was lattice encoded message may be represented by $W_{0,i}, \ldots, W_{0,M}$ excluding $W_{0,i}$. The (M−1) general encoded signals may be represented by $U_{0,1}, \ldots, U_{0,M}$.

The general encoding unit 730 generates the (M−1) general encoded signals by performing random coding of the remaining (M−1) transmission messages.

The dithering unit 740 generates a single transmission signal $X_{0,i}$ by dithering the lattice encoded signal $C_{0,i}$ to satisfy a power constraint criterion of a transmission channel 780.

The broadcasting unit 745 generates another single transmission signal $X_{0,ii}$ by performing Costa's dirty paper coding of the (M−1) general encoded signals $U_{0,1}, \ldots, U_{0,M}$.

The mixing unit 750 mixes the two single transmission signals into a single output signal. For example, the mixing unit 750 a single output signal $X_0$ by mixing the two single transmission signals $X_{0,i}$ and $X_{0,ii}$.

While the base station generates the single output signal $X_0$, the i-th user node generates a lattice encoded signal $C_{i,0}$ by lattice encoding a transmission message $W_{i,0}$ 760 with a lattice encoding unit 770, and generates a transmission signal $X_i$ by dithering the lattice encoded signal $C_{i,0}$ with a dithering unit 775.

The single output signal $X_0$ of the base station, the transmission signal $X_i$ of the i-th user node, and noise $Z_r$ of the transmission channel 780 are mixed in the same transmission channel 780 to obtain a mixed signal $Y_{ri}$. The mixed signal $Y_{ri}$ is transmitted to the relay node.

Also, the output signal $X_0$ of the base station, the transmission signal $X_i$ of the i-th user node, and noise $Z_i$ attributable to the i-th user node are mixed in the same transmission channel 780 to obtain a mixed signal $Y_i$ in a time interval $t_i$. The mixed signal $Y_i$ is transmitted to the i-th user node in $t_i$. In this example, $t_i$ may be the same as any of $t_1$ to $t_M$ in FIG. 2B. For example, the output signal $X_0$ of the base station, the transmission signal $X_1$ of the first user node, and noise $Z_1$ attributable to the first user node are mixed in the same channel 780 to obtain a mixed signal $Y_1$ in the time interval $t_1$. The mixed signal $Y_1$ is transmitted to the first user node in $t_1$. In addition, the output signal $X_0$ of the base station, the transmission signal $X_M$ of the M-th user node, and noise $Z_M$ attributable to the M-th user node are mixed in the same transmission channel 780 to obtain a mixed signal $Y_M$ in the time interval $Y_M$. The mixed signal $Y_M$ is transmitted to the M-th user node in $Y_M$.

The lattice encoding unit 720, the general encoding unit 730, the dithering unit 740, the broadcasting unit 745, the mixing unit 750, the lattice encoding unit 770, and the dithering unit 775 in FIG. 7 may be hardware devices, or may be software modules implemented by a processor or a computer executing software that performs the operations described above, or may be a combination of hardware devices and software modules.

Figure 8:
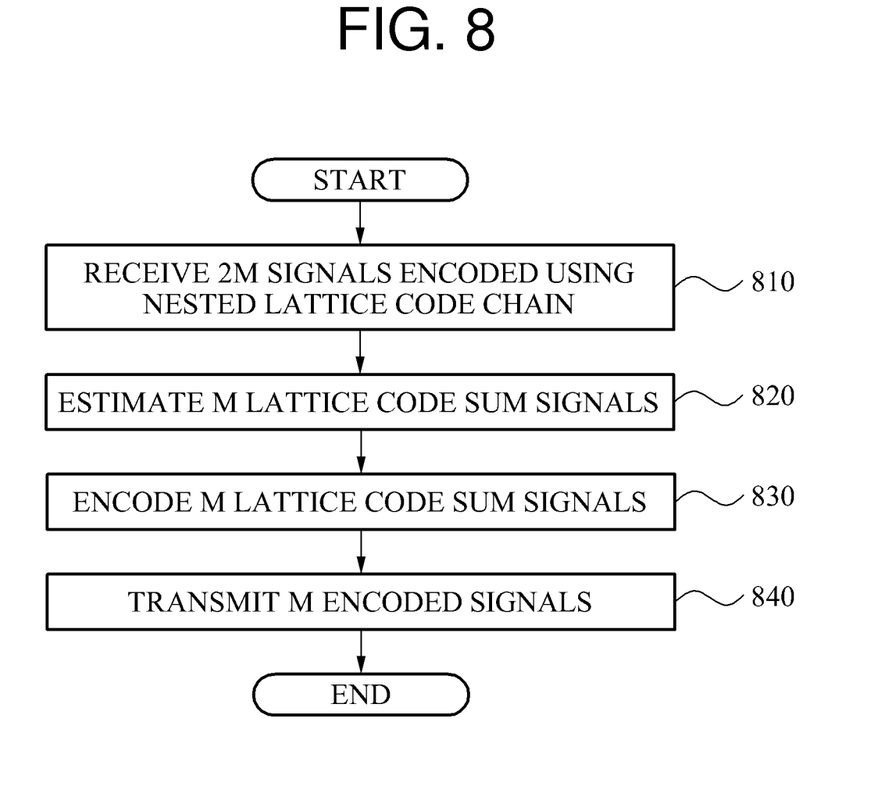
FIG. 8 is a flowchart illustrating an example of a bidirectional communication method between multi-nodes using a relay node from the point of view of the relay node.

FIG. 8 is a flowchart illustrating an example of a bidirectional communication method between multi-nodes using a relay node from the point of view of the relay node.

In 810, the relay node receives 2M signals, encoded using a nested lattice code chain, from a base station and M user nodes in a predetermined time interval.

In 820, the relay node estimates M pairwise lattice code sum signals between the base station and the M user nodes based on the nested lattice code chain with respect to the 2M encoded signals.

In this example, the relay node estimates linear combination signals by performing Euclidean lattice decoding of the 2M encoded signals, based on a predetermined generator matrix, within a range of a coarsest lattice code set.

The relay node estimates the M lattice code sum signals based on a relationship between a linear combination vector including the estimated linear combination signals as elements and a restore matrix including integers as elements.

In 830, the relay node encodes the M lattice code sum signals to broadcasting codewords after the predetermined time interval has ended.

In 840, the relay node transmits the M encoded signals to the base station and the M user nodes.

The relay node estimates the M lattice code sum signals and transmits the M encoded signals to the base station and the M user nodes using the scheme described with reference to FIG. 4.

Figure 9:
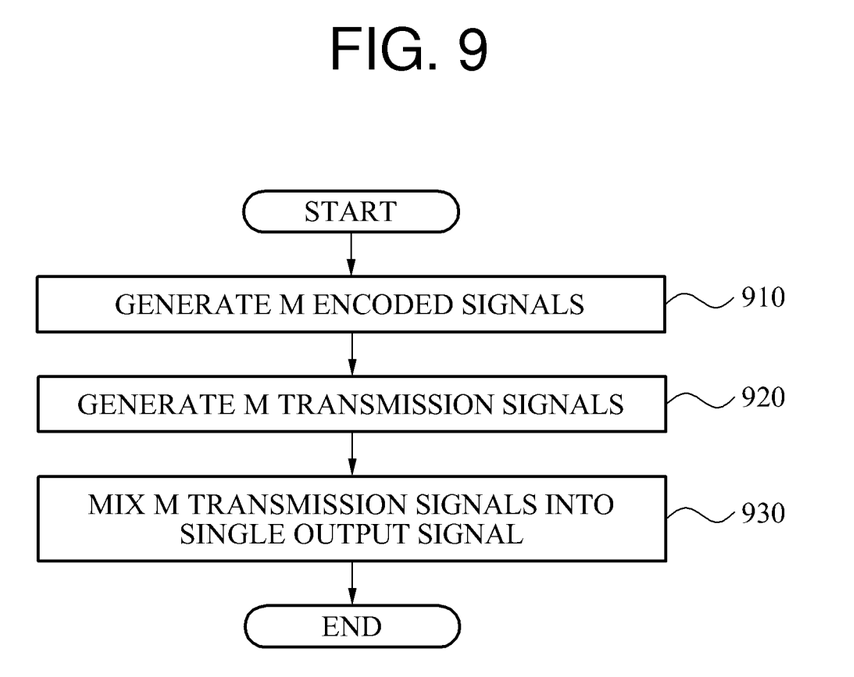
FIG. 9 is a flowchart illustrating an example of a bidirectional communication method between multi-nodes using a relay node from the point of view of a base station.

FIG. 9 is a flowchart illustrating an example of a bidirectional communication method between multi-nodes using a relay node from the point of view of a base station.

In 910, the base station generates M encoded signals by mapping M transmission messages to M lattice codewords in a nested lattice code chain including 2M lattices.

In 920, the base station generates M transmission signals by dithering the M encoded signals to satisfy a power constraint criterion of a transmission channel.

In 930, the base station mixes the M transmission signals into a single output signal.

The base station generates the M encoded signals and the M transmission signals using the scheme described above with reference to FIG. 5.

The processes, functions, methods and/or software described above may be recorded, stored, or fixed in one or more non-transitory computer-readable storage medium that includes program instructions to be implemented by a computer to cause a processor of the computer to execute or perform the program instructions. The medium may also include, alone or in combination with the program instructions, data files, data structures, and the like. The medium and the program instructions may be those specially designed and constructed, or they may be of the kind well known and available to tone of ordinary skill in the computer software arts. Examples of a non-transitory computer-readable medium include magnetic media such as hard disks, floppy disks, and magnetic tape; optical media such as CD ROM disks and DVDs; magneto-optical media such as optical discs; and hardware devices that are specially configured to store and perform program instructions, such as read-only memory (ROM), random access memory (RAM), flash memory, and the like. Examples of program instructions include both machine code, such as is produced by a compiler, and files containing higher level code that may be executed by the computer using an interpreter. The described hardware devices may be configured to act as one or more software modules in order to perform the operations and methods described above, or vice versa. In addition, the non-transitory computer-readable storage medium may be distributed among computer systems connected through a network, and non-transitory computer-readable codes or program instructions may be stored and executed in a decentralized manner.

Several examples have been described above. Nevertheless, it should be understood that various modifications may be made to these examples. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the claims and their equivalents.

What is claimed is:

1. An apparatus for bidirectional communication between multi-nodes using a relay node, the apparatus comprising:
   a receiver configured to receive 2M signals encoded using a nested lattice code chain, from a base station and M user nodes in a predetermined time interval;
   a decoding unit configured to estimate linear combination signals of the 2M encoded signals, and estimate M lattice code sum signals with respect to the 2M encoded signals based on a relationship between the estimated linear combination signals and a restore matrix, the M lattice code sum signals being paired between the base station and the M user nodes, based on the nested lattice code chain; and
   a transmitter configured to encode the paired M lattice code sum signals to broadcasting codewords to generate M encoded signals and transmit the M encoded signals to the base station and the M user nodes, after the predetermined time interval has ended.

2. The apparatus of claim 1, wherein the decoding unit comprises:
   a first decoder configured to estimate linear combination signals by performing Euclidean lattice decoding of the 2M encoded signals, based on a predetermined generator matrix, within a range of a coarsest lattice code set; and
   a second decoder configured to estimate the paired M lattice code sum signals based on a relationship between a linear combination vector comprising the estimated linear combination signals as elements and the restore matrix comprising integers as elements.

3. The apparatus of claim 2, wherein the generator matrix comprises 1 and 0 as elements;
   ones of the elements corresponding to signals to be recognized as messages among the 2M encoded signals are set to 1;
   ones of the elements corresponding to signals to be recognized as noise among the 2M encoded signals are set to 0; and
   a product of the generator matrix and the restore matrix is an identity matrix.

4. The apparatus of claim 3, wherein ones of the elements corresponding to signals that map to the coarsest lattice code set among the 2M encoded are set to 1 so that the mapping signals are recognized as the messages.

5. An apparatus for bidirectional communication between multi-nodes using a relay node, the apparatus comprising:
   a receiver configured to receive a single signal, encoded using a lattice code, and (M−1) signals, broadcast encoded, from a base station in a predetermined time interval, and receive a signal, encoded using the lattice code, from one of M user nodes in the predetermined time interval; and
   a decoder configured to estimate linear combination signals of the encoded signals received from the base station and the one of the M user nodes, and estimate a lattice code sum signal with respect to the single encoded signal that is received from the base station and the encoded signal that is received from one of the M user nodes, based on a relationship between the estimated linear combination signals and a restore matrix.

6. The apparatus of claim 5, wherein the receiver is further configured to receive M signals, encoded using the lattice code, from the base station in a plurality of different time intervals, and receive M signals, encoded using the lattice code, from the M user nodes in the plurality of different time intervals; and
   the decoder is further configured to estimate M lattice code sum signals with respect to the M signals received from the base station and the M signals received from the M user nodes corresponding to the M signals.

7. The apparatus of claim 6, further comprising a transmitter configured to encode the M lattice code sum signals to broadcasting codewords to generate M encoded signals, and transmit the M encoded signals to the base station and the M user nodes after the plurality of different time intervals have ended.

8. A method for bidirectional communication between multi-nodes using a relay node, the method comprising:

receiving 2M signals, encoded using a nested lattice code chain, from a base station and M user nodes in a predetermined time interval;

estimating linear combination signals of the encoded 2M signals;

estimating M lattice code sum signals with respect to the 2M encoded signals, based on a relationship between the estimated linear combination signals and a restore matrix, the M lattice code sum signals being paired between the base station and the M user nodes, based on the nested lattice code chain;

encoding the estimated M lattice code sum signals to broadcasting codewords to generate M encoded signals after the predetermined time interval has ended; and transmitting the M encoded signals to the base station and the M user nodes.

9. The method of claim 8, wherein:

the estimating the linear combination signals comprising estimating linear combination signals by performing Euclidean lattice decoding of the 2M encoded signals, based on a predetermined generator matrix, within a range of a coarsest lattice code set; and the estimating M lattice code signals comprising estimating the M lattice code sum signals based on the relationship between a linear combination vector comprising the estimated linear combination signals as elements and the restore matrix comprising integers as elements.

* * * * *